United States Patent
Crocherie et al.

(10) Patent No.: US 10,497,735 B2
(45) Date of Patent: Dec. 3, 2019

(54) IMAGE SENSOR WITH REDUCED DEFECTS

(71) Applicant: STMicroelectronics (Crolles 2) SAS, Crolles (FR)

(72) Inventors: Axel Crocherie, Grenoble (FR); Etienne Mortini, Crolles (FR); Jean Luc Huguenin, Grenoble (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 15/926,491

(22) Filed: Mar. 20, 2018

(65) Prior Publication Data
US 2018/0331136 A1 Nov. 15, 2018

(30) Foreign Application Priority Data
May 11, 2017 (FR) ..................................... 17 54147

(51) Int. Cl.
*H01L 27/146* (2006.01)

(52) U.S. Cl.
CPC ...... *H01L 27/1464* (2013.01); *H01L 27/1462* (2013.01); *H01L 27/14603* (2013.01); *H01L 27/14623* (2013.01); *H01L 27/14629* (2013.01); *H01L 27/14636* (2013.01); *H01L 27/14643* (2013.01)

(58) Field of Classification Search
CPC ................................................ H01L 27/14603
See application file for complete search history.

(56) References Cited

U.S. PATENT DOCUMENTS

| | | | |
|---|---|---|---|
| 2005/0274988 A1* | 12/2005 | Hong | H01L 27/14625 257/225 |
| 2005/0285215 A1 | 12/2005 | Lee et al. | |
| 2006/0102940 A1 | 5/2006 | Cha et al. | |
| 2007/0040194 A1* | 2/2007 | Misawa | H01L 27/14623 257/291 |
| 2011/0057279 A1* | 3/2011 | Lee | H01L 27/14609 257/432 |
| 2012/0001289 A1* | 1/2012 | Ahn | H01L 27/14621 257/432 |
| 2014/0049983 A1* | 2/2014 | Nichol | G02B 6/0018 362/610 |
| 2017/0153401 A1* | 6/2017 | Kurita | G02B 6/131 |
| 2017/0225487 A1* | 8/2017 | Sawamura | B41J 3/4073 |
| 2018/0006079 A1* | 1/2018 | Anzagira | H01L 27/14621 |
| 2018/0178034 A1* | 6/2018 | Iguchi | A61N 5/0616 |

FOREIGN PATENT DOCUMENTS

EP 1401025 A2 3/2004
WO 2017064845 A1 4/2017

* cited by examiner

*Primary Examiner* — Thao P Le
(74) *Attorney, Agent, or Firm* — Slater Matsil, LLP

(57) ABSTRACT

The invention relates to an image sensor and method for reducing image defects. A photoconversion area is formed in a semiconductor layer. An insulating layer formed over the semiconductor layer contains a metal element. A lens over the insulting layer is positioned opposite the photoconversion area to focus light on it. A layer of light-absorbing material is deposited on the side of the metal element facing the lens to prevent reflection of parasitic light rays within the image device.

19 Claims, 3 Drawing Sheets

IMAGE SENSOR WITH REDUCED DEFECTS

CROSS-REFERENCE TO RELATED APPLICATIONS

This application claims priority to French Application No. 1754147, filed on May 11, 2017, which application is hereby incorporated herein by reference.

TECHNICAL FIELD

The present application relates to image sensors and their methods of manufacture.

BACKGROUND

An image sensor conventionally comprises a matrix of pixels each comprising a photodiode and a control circuit suitable for providing an output signal representative of the level of illumination received by its photodiode. Such a sensor makes it possible to acquire a discretized and digitized image of a scene (or digital image).

FIG. 1 is a partial sectional view of an example of a front-illuminated image sensor. More precisely, FIG. 1 illustrates two pixels of a pixel matrix of the image sensor. Each pixel includes a photoconversion area 2 consisting of a layer of semiconductor material. The image sensor optionally includes memory areas 4 formed in the layer of semiconductor material. The photoconversion areas 2 are separated from each other and the memory areas 4 by deep isolation trenches 6 or DTI ("Deep Trench Isolation"), which makes it possible to electrically and optically isolate them. Various transistors, not represented, e.g., selection, transfer and initialization transistors, may also be formed in and on the layer of semiconductor material.

The image sensor further includes an insulating layer 8, e.g., made of silicon oxide, covering the layer of semiconductor material. Interconnection levels are buried in the insulating layer 8. The interconnection levels are formed of metallizations 10 connected to each other by conductive vias (not shown). The interconnection levels make it possible to connect different elements formed in and/or on the layer of semiconductor material, e.g., transistors (not shown), to each other or to the surface of the structure. The metallizations 10 are placed in the insulating layer 8 in such a way that the portions of the insulating layer 8 opposite each photoconversion area 2 are free of metallizations 10, which allows the passage of light rays up to the photoconversion area 2. Metallizations may further be formed above memory areas 4 so as to prevent light rays from reaching these areas.

In the example represented in FIG. 1, the structure is covered with another layer 12 of insulator. The layer 12 is, for example, an anti-reflection layer. Lenses 14 are arranged on the layer 12. A lens 14 is placed opposite each photoconversion area 2 so as to focus the light rays towards the corresponding photoconversion area 2. Additional layers may be placed between the lenses 14 and photoconversion areas 2, e.g., color filters.

The features of the lenses 14 located opposite the photoconversion areas 2, e.g., their focal distance, are determined in such a way that substantially all of the light rays the wavelengths of which belong to a selected wavelength range reach the photoconversion area 2.

In the example in FIG. 1, this wavelength range corresponds to the visible domain, i.e. wavelengths between 380 and 780 nm.

Defects commonly appear on the digital image when using sensors such as those currently manufactured. These defects appear notably when the scene comprises very bright objects, e.g., the sun. Often a deformation of the image is found, e.g., the formation of halos ("flare") around the sun, or the presence of ghost images, e.g., multiple suns.

It would be desirable to provide an image sensor remedying all or part of these drawbacks.

SUMMARY

Embodiments provide an image sensor including a metal element located on the side of the face intended to receive illumination with respect to a photoconversion area. The metal element is at least partially covered, on the side of the face intended to receive illumination, with an absorbent material absorbing the light rays.

According to embodiments, the sensor is of the front-illuminated type.

According to embodiments, the metal element is a metallization of the upper interconnection level.

According to embodiments, the sensor is of the back-illuminated type.

According to embodiments, the metal element is located opposite a memory area on the side of the face intended to receive illumination.

According to embodiments, the absorbent material is composed of metal particles capable of absorbing light rays.

According to embodiments, the thickness of absorbent material is between 100 and 500 nm.

Embodiments provide a method for manufacturing an image sensor in which a layer of material suitable for absorbing light rays is deposited over an insulating layer on the side of the face intended to receive illumination with respect to the photoconversion area. The light-absorbing material is then removed except for portions at least partially covering metal elements located in the insulating layer facing the source of illumination.

BRIEF DESCRIPTION OF THE DRAWINGS

These features and advantages, as well as others, will be disclosed in detail in the following non-restrictive description of particular embodiments in relation to the accompanying figures in which.

DETAILED DESCRIPTION OF ILLUSTRATIVE EMBODIMENTS

The same elements have been designated by the same references in the different figures and, in addition, the various figures are not drawn to scale. For the sake of clarity, only the elements useful to the understanding of the embodiments described have been represented and are given in detail.

In the description that follows, when qualifiers are mentioned such as the terms "front", "back", "above", "upper", "lower", etc. this refers to the orientation of the elements concerned in the figures. Unless otherwise specified, the expressions "approximately" and "substantially" mean within 10%, preferably within 5%.

The defects appearing in the digital images produced by the image sensors such as the one previously described will be explained here in relation to FIG. 1.

Figure 1:
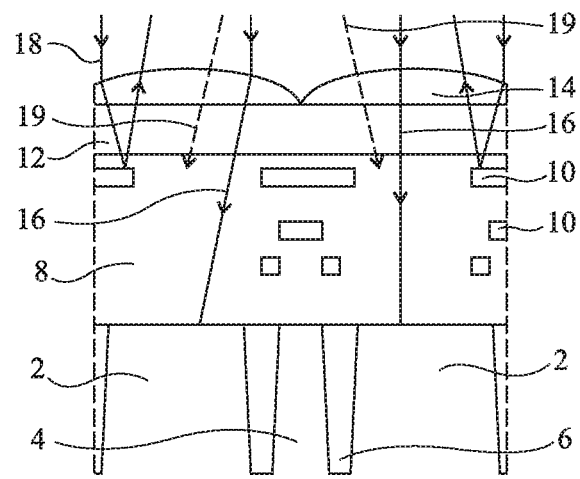
FIG. 1 is a partial sectional view of a front-illuminated image sensor.

FIG. 1 illustrates light rays received by the image sensor. These rays may be divided into two categories: useful light rays 16 that actually reach the photoconversion area 2, and parasitic light rays 18. The quantity of parasitic rays depends on the wavelength of the light, the dimensions of the pixel and the part of the lens 14 traversed by the incident ray. In particular, when light rays have a wavelength on the order of the dimensions of the lens, a significant part of the light is parasitically diffracted.

The parasitic rays 18 are likely to reach metallizations 10 and thence be reflected outwards. The rays 18 may then be reflected onto elements (e.g., sensors, lenses, filters, not shown), placed opposite the pixel, and return to a different pixel in the form of parasitic light rays 19. Such rays 19 are represented by a dotted line in FIG. 1.

The parasitic rays 19 cause the occurrence of the previously mentioned phenomena, i.e. halos and ghost images.

The structure described in relation to FIG. 1 is a front-illuminated structure in which the interconnection levels are located between the side intended to receive illumination and the photoconversion areas 2. The structure of an image sensor may also be a back-illuminated structure an example of which will be described in relation to FIG. 3, and in which the photoconversion areas are located between the face intended to receive illumination and the interconnection levels. In such a structure, a metal element is generally arranged above each memory area, if there are any, so as to block the light rays that could reach the memory area. This metal element may cause parasitic reflections of light rays 18 in the same way as the metallizations 10 and thus contribute towards the occurrence of the defects previously described.

It would be desirable to provide an image sensor at least partially remedying these problems.

Figure 2:
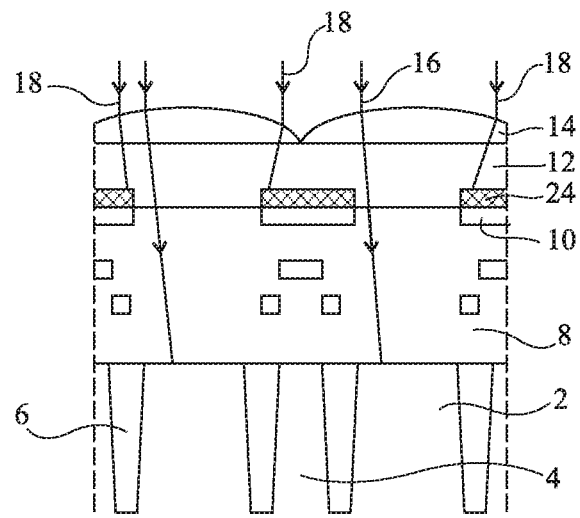
FIG. 2 is a partial sectional view of an embodiment of an image sensor having a structure of the front-illuminated type.

FIG. 2 is a sectional view of an embodiment of an image sensor having a structure of the front-illuminated type similar to that in FIG. 1. Various elements of the structure in FIG. 1 are present in the structure in FIG. 2. These elements are designated by the same references and are not described again.

The metallizations 10 of the upper interconnection level of the structure in FIG. 2 are flush with the surface of the layer 8 of insulator. It is also possible for the metallizations 10 to be located under a layer of insulator. Portions 24 of light-absorbing material for absorbing light rays at least partially cover the metallizations 10 of the interconnection level. Each portion 24 of light-absorbing material is preferably embedded in the insulating layer 12.

The portions 24 of absorbent material have, for example, a thickness of between 100 and 500 nm, e.g., 200 nm. The surface of each portion 24 and the surface of the metallization 10 with which it is in contact have approximately the same dimensions.

The light-absorbing material is, for example, an opaque resin or a compound including metal particles capable of absorbing light. The types of metals used depend on the wavelength range to be absorbed. These metal particles may be, for example, particles of tungsten or titanium in the case of near infrared, i.e. wavelengths between 780 nm and 3 µm.

The parasitic rays 18 reaching the portions 24 are absorbed instead of being reflected by the metallizations 10. The defects previously described are therefore significantly reduced.

Figure 3:
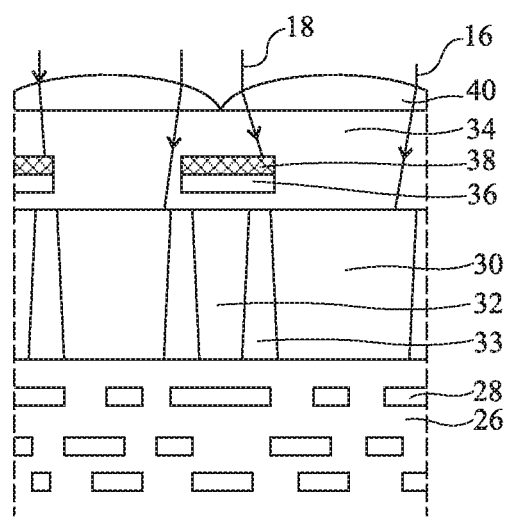
FIG. 3 is a partial sectional view of an embodiment of an image sensor having a structure of the back-illuminated type.

FIG. 3 is a partial sectional view of an embodiment of an image sensor having a structure of the back-illuminated type. More precisely, FIG. 3 illustrates two pixels of a pixel matrix.

The sensor described includes a layer 26 of insulator, e.g., silicon oxide, in which interconnection levels are buried formed of metallizations 28 connected to each other by conductive vias (not shown).

Above the layer 26 of insulator is a layer of semiconductor material including the photoconversion areas 30, two of which are represented in FIG. 3, memory areas 32, two of which are represented, as well as other components not represented, e.g., transistors. The photoconversion areas 30 are separated from each other and the memory areas 32 by deep isolation trenches 33, which make it possible to electrically and optically isolate them.

The layer of semiconductor material is covered by an insulating layer 34. Metal elements 36 are buried in the layer 34 opposite the memory areas 32. The metal elements 36 do not have an electrical function and only serve to prevent the light rays from reaching the memory areas.

The metal elements 36 in the insulating layer 34 are covered with portions 38 of a light-absorbing material for absorbing the light rays. Each portion 38 of absorbent material at least partially covers the upper face of the metal element 36 with which it is in contact, preferably substantially the whole of the upper face.

The portions 38 of light-absorbing material are identical to the portions 24 of absorbent material described above.

Lenses 40 are arranged on the insulating layer 34. Each lens is located opposite a photoconversion area 30.

FIG. 3 illustrates light rays 16 and 18 as previously defined. The parasitic rays 18 are absorbed by the portions 38 of absorbent material. As in the case of the front-illuminated sensor illustrated in FIG. 2, the defects due to the reflection of parasitic rays 18 are significantly reduced.

FIGS. 4A to 4E illustrate steps for manufacturing four pixels of the image sensor illustrated in FIG. 2.

Figure 4A:
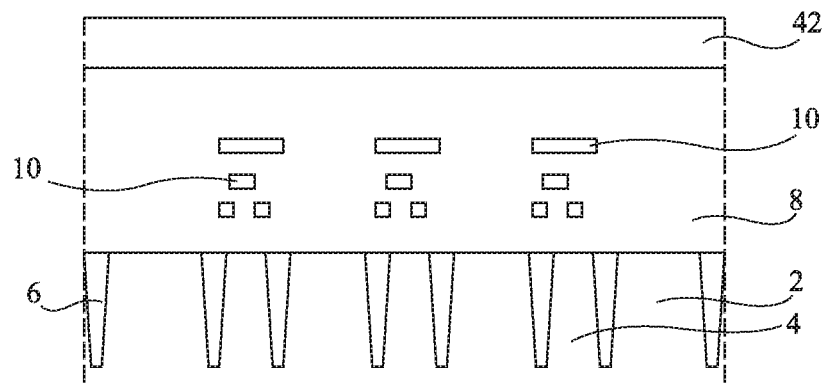
FIGS. 4A to 4E are partial sectional views illustrating steps in an example of a method for manufacturing the sensor in FIG. 2.

FIG. 4A illustrates the result of an initial step of manufacturing including conventional steps for manufacturing a front-illuminated image sensor. In the course of this step, components are formed in a layer of semiconductor material. In particular, photoconversion areas 2 associated with memory areas 4, four of which are represented in FIG. 4A, as well as transistors (not shown) are formed in and on the layer of semiconductor material. Deep insulating trenches 6 are also formed in the layer of semiconductor material so as to separate the different areas.

The layer of semiconductor material is covered with an insulating layer 8 in which interconnection levels composed of metallizations 10 are formed connected to each other by vias (not shown). The interconnection levels are located in such a way that the portions of the insulating layer 8 opposite the photoconversion areas 2 are free of metallizations.

The insulating layer 8 is covered with a layer 42 of passivation, e.g., made of silicon nitride.

The insulating layers 42 and 8 may extend over the whole structure of a chip and not only over the pixel matrix. For example, these layers may cover logic circuits (not shown) close to the pixel matrix in order to protect them during the following steps of the method. In the case where the layers 42 and 8 are not used for protection purposes, it is possible to halt this initial step after the formation of the upper interconnection level and not perform the step illustrated in FIG. 4B.

Figure 4B:
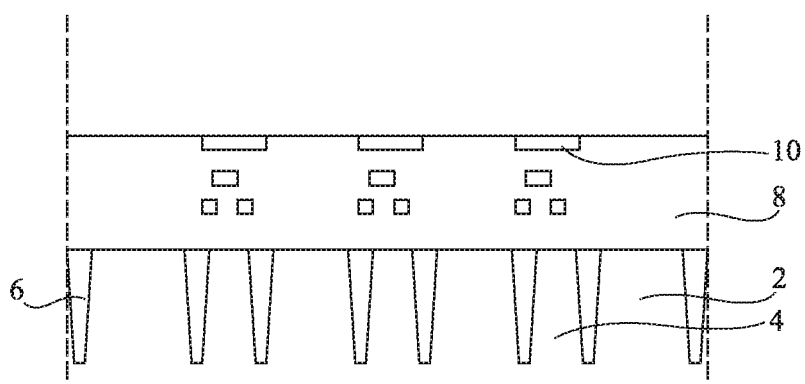

In the step illustrated in FIG. 4B, the layers 42 and 8 are etched above the pixel matrix until the metallizations 10 of the upper interconnection level are revealed.

Figure 4C:
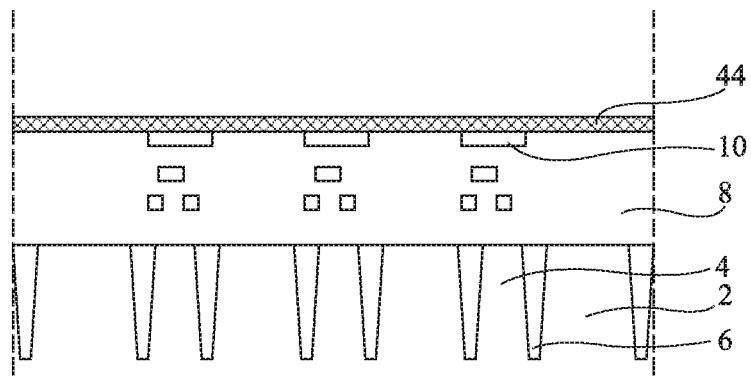

In the step illustrated in FIG. 4C, a layer 44 of light-absorbing material is deposited on the structure. The layer 44 has, for example, a thickness of between 100 and 500 nm, e.g., 200 nm.

Figure 4D:
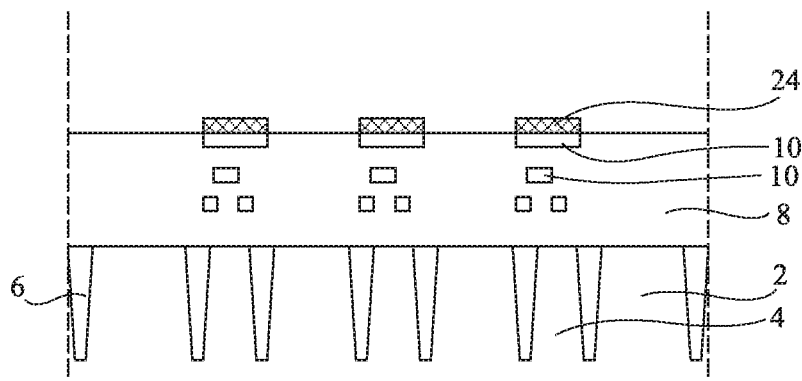

In the step illustrated in FIG. 4D, the layer 44 of light-absorbing material is removed, with the exception of portions 24 at least partially covering each of the upper faces of the metallizations 10 of the upper interconnection level.

Figure 4E:
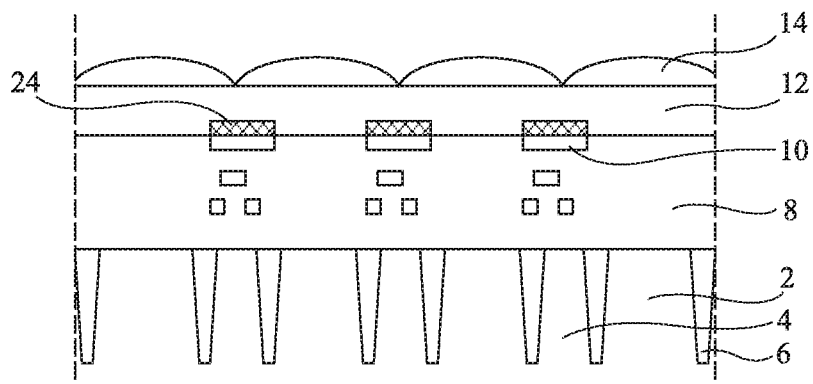

In the step illustrated in FIG. 4E, an insulating layer 12 is deposited on the structure. Various layers (not shown) may be deposited in this step, e.g., layers forming color filters.

Lenses 14 are then arranged on the structure. A lens 14 is arranged opposite each photoconversion area 2.

In the case of a back-illuminated image sensor such as that illustrated in FIG. 3, the steps for manufacturing the portions of absorbent material are similar to those of a front-illuminated sensor. The conventional steps for manufacturing a back-illuminated sensor are performed until the formation of the insulating layer 34 containing metal elements 36 opposite memory areas 32. The following steps are the same as those described in relation to FIGS. 4B to 4E, with the exception of the step illustrated in FIG. 4B where the structure is etched up to the metal elements 36 and not up to the metallizations 10.

Particular embodiments have been described. Various variants and modifications will be apparent to the person skilled in the art.

What is claimed is:

1. A method of making an image sensor, the method comprising:
    forming a photoconversion area in a semiconductor layer;
    configuring a lens opposite the photoconversion area to focus light onto the photoconversion area;
    forming an uppermost interconnect level by
        forming an insulating layer between the photoconversion area and lens;
        forming a metal element within the insulating layer, the uppermost interconnect level having a major outer surface that is substantially planar, the major outer surface comprising a top surface of the metal element and a top surface of the insulating layer;
    depositing a layer of light-absorbing material onto, the layer of light-absorbing material contacting the top surface of the metal element and the top surface of the insulating layer;
    patterning the layer of light-absorbing material to expose portions of the major outer surface of the uppermost interconnect level comprising the top surface of the insulating layer; and
    covering the portions of the major outer surface of the uppermost interconnect level with another insulating layer, wherein the patterned layer of light-absorbing material prevents reflection of parasitic light rays within the image sensor, and wherein the another insulating layer is formed between the lens and the patterned layer of light-absorbing material.

2. The method according to claim 1, wherein the layer of light-absorbing material comprises an opaque resin.

3. The method according to claim 1, wherein the layer of light-absorbing material comprises metal particles capable of absorbing light.

4. The method according to claim ii, wherein the layer of light-absorbing material has a thickness of 100 to 500 nm.

5. A method of manufacturing an image sensor, the method comprising:
    forming a photoconversion area in a semiconductor layer;
    forming a memory area in the semiconductor layer;
    forming a deep isolation trench separating the photoconversion area from memory area within the semiconductor layer;
    forming an insulating layer over the semiconductor layer;
    forming a metal element within the insulating layer, wherein the metal element is positioned opposite the memory area;
    depositing a layer of light-absorbing material over the insulating layer;
    removing the layer of light-absorbing material, except for a portion at least partially covering an upper surface of the metal element facing away from the semiconductor layer; and
    positioning a lens over the insulating layer, wherein the lens is positioned opposite the photoconversion area and is configured to focus light onto the photoconversion area.

6. The method according to claim 5, wherein the metal element is a metallization region within an interconnection layer.

7. The method according to claim 5, wherein the layer of light-absorbing material comprises an opaque resin.

8. The method according to claim 5, wherein the layer of light-absorbing material comprises metal particles capable of absorbing light.

9. The method according to claim 5, wherein the layer of light-absorbing material has a thickness of 100 to 500 nm.

10. A method of making an image sensor, the method comprising:
    forming a photoconversion area in a semiconductor layer;
    forming a memory area in the semiconductor layer;
    forming a deep isolation trench within the semiconductor layer separating the photoconversion area from the memory area;
    forming an insulating layer over the photoconversion area;
    forming a metal element within the insulating layer, the metal element having a first side facing the photoconversion area and a second side facing away from the photoconversion area, wherein the metal element is positioned adjacent the memory area;
    forming a layer of light-absorbing material over the second side of the metal element; and
    forming a lens over the layer of light-absorbing material, the lens configured to focus light onto the photoconversion area.

11. The method according to claim 10, wherein the metal element is a metallization region within an interconnection layer.

12. The method according to claim 10, wherein the insulating layer is an anti-reflection layer.

13. The method according to claim 10, wherein the layer of light-absorbing material comprises an opaque resin.

14. The method according to claim 10, wherein the layer of light-absorbing material comprises metal particles capable of absorbing light.

15. The method according to claim 14, wherein the metal particles comprise tungsten or titanium.

16. The method according to claim 10, wherein the layer of light-absorbing material has a thickness of 100 to 500 nm.

17. The method according to claim 10, further comprising forming a metallization between the metal element and the photoconversion area, wherein the image sensor is a front-illuminated sensor.

18. The method according to claim 10, further comprising forming a metallization under the photoconversion area so that the photoconversion area is between the insulating layer and the metallization, wherein the image sensor is a back-illuminated sensor.

19. The method according to claim 1, further comprising:
   forming a memory area in the semiconductor layer, wherein the metal element is positioned adjacent the memory area; and
   forming a deep isolation trench within the semiconductor layer separating the photoconversion area from the memory area.

\* \* \* \* \*